(12) United States Patent
Park et al.

(10) Patent No.: US 8,070,258 B2
(45) Date of Patent: Dec. 6, 2011

(54) INKJET HEAD

(75) Inventors: Yoon-Sok Park, Daejeon (KR);
Jae-Woo Joung, Suwon-si (KR);
Young-Seuck Yoo, Seoul (KR)

(73) Assignee: Samsung Electro-Mechanics Co., Ltd.,
Gyunggi-Do (KR)

( * ) Notice: Subject to any disclaimer, the term of this patent is extended or adjusted under 35 U.S.C. 154(b) by 288 days.

(21) Appl. No.: 12/402,102

(22) Filed: Mar. 11, 2009

(65) Prior Publication Data

US 2010/0103222 A1     Apr. 29, 2010

(30) Foreign Application Priority Data

Oct. 29, 2008   (KR) .................. 10-2008-0106421

(51) Int. Cl.
*B41J 2/17*       (2006.01)
(52) U.S. Cl. ........................................ 347/47

(58) Field of Classification Search ............... 347/47, 347/40, 43
See application file for complete search history.

(56) References Cited

FOREIGN PATENT DOCUMENTS

JP        2008-105255        5/2008

OTHER PUBLICATIONS

Korean Office Action issued in Korean Patent Application No. KR 10-2008-0106421 dated Sep. 30, 2010.

*Primary Examiner* — Lamson Nguyen
(74) *Attorney, Agent, or Firm* — McDermott Will & Emery LLP

(57) ABSTRACT

An inkjet head is disclosed. The inkjet head, which include a head body, having one side, in which a nozzle is formed to discharge ink; and a protrusion, formed in one side of the head body, spaced from the nozzle, can form a groove on the surface of a printing target in the printing and then discharge ink in the groove, thereby increasing the aspect ratio of a printed line.

4 Claims, 7 Drawing Sheets

INKJET HEAD

CROSS-REFERENCE TO RELATED APPLICATIONS

This application claims the benefit of Korean Patent Application No. 10-2008-0106421, filed with the Korean Intellectual Property Office on Oct. 29, 2008, the disclosure of which is incorporated herein by reference in its entirety.

BACKGROUND

1. Technical Field

The present invention relates to an inkjet head.

2. Description of the Related Art

Today, one of the most actively developed functional inkjet fields is a method of directly performing the printing by using metal ink and an inkjet printer. This method can directly print a metal line, which is formed by undergoing the conventional processes, such as metal deposition, photolithography, and metal etching, without reference to a board. Metal lines and electrodes are essential in various semiconductor fields and electric and electronic fields, and thus their usage covers a wide range.

One of the problems currently generated when the metal lines are formed by using the direct printing method is difficulty of controlling the height of the metal line. The reason that lines or electrodes are made of metals is that the conductivity of the metals is high (i.e., the resistance is low). The conductivity of the metal lines is dependent on the shape of the cross-section as well as the conductivity of the metal.

The design or the line width is predetermined in the inkjet printing. Accordingly, an ink droplet having a certain volume is discharged to reproduce a certain line width. At this time, it is very difficult to adjust the line height. Of course, it is possible to adjust the aspect ratio of the metal line to a certain degree by using the physical properties of the ink or the surface condition of the board, but there remain several restrictions. It is also possible to increase the line height by repeatedly discharging the metal ink, but this is restricted because the designed line width should be maintained.

If a finer line were to be realized, it would be inevitable that the printed metal line has a lower height, thereby increasing the resistance and lowering the quality of the metal line.

FIG. 1A through FIG. 1B show how an inkjet head performs the printing according to the conventional art. The shape (i.e. width and height) of the discharged ink droplet on the board depends on the physical properties inherent in the ink and the surface condition, for example, the angle of contact, of the board. As shown in FIG. 1C, the metal line can be formed by repeatedly discharging and sintering various ink droplets.

SUMMARY

The present invention provides an inkjet head that can increase the aspect ratio of a printed line.

An aspect of present invention features an inkjet head including a head body, one side of which is formed with a nozzle for discharging ink; and a protrusion, formed in one side of the head body, spaced from the nozzle.

A plurality of nozzles can be formed, and a plurality of protrusions can be formed corresponding to the nozzles.

The protrusion can be made of a same material as that of the head body.

DETAIL DESCRIPTION

Figure 1A:
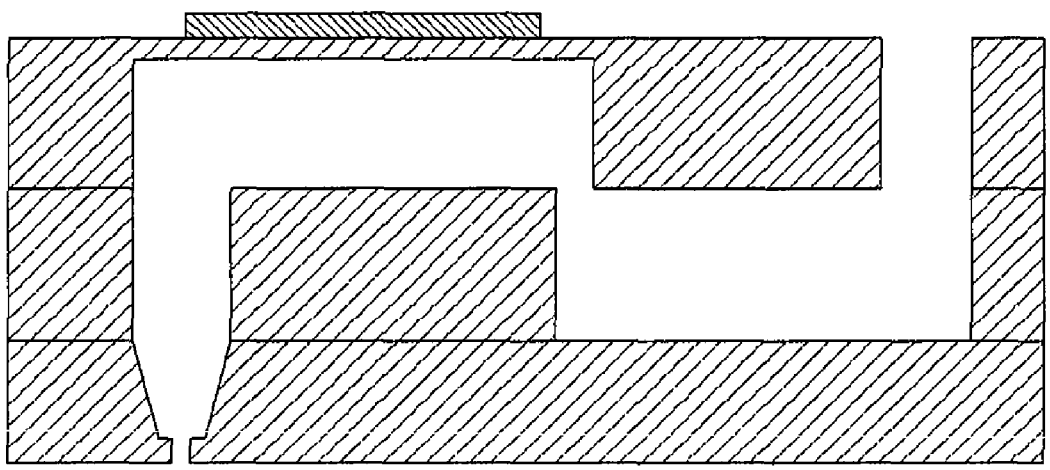
FIG. 1A through FIG. 1B show how an inkjet head performs the printing according to the conventional art.
Figure 1B:
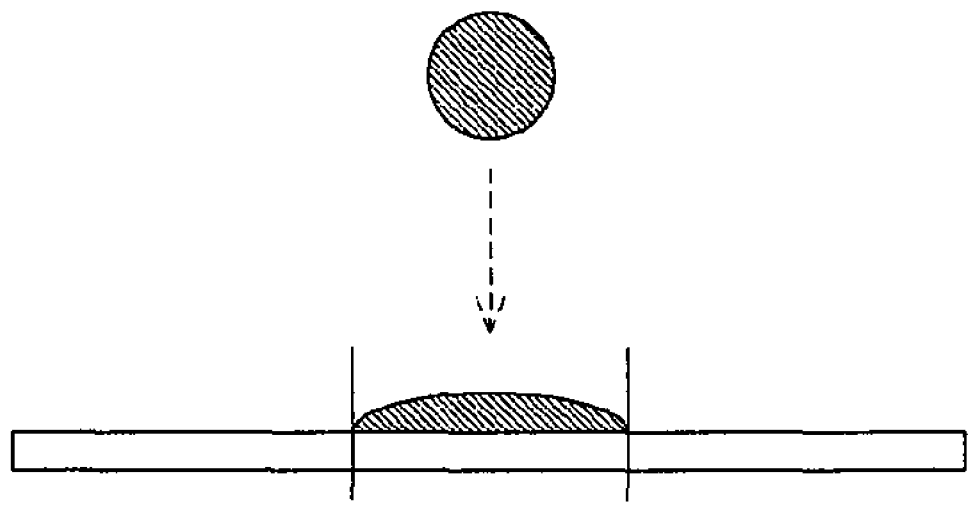
Figure 1C:
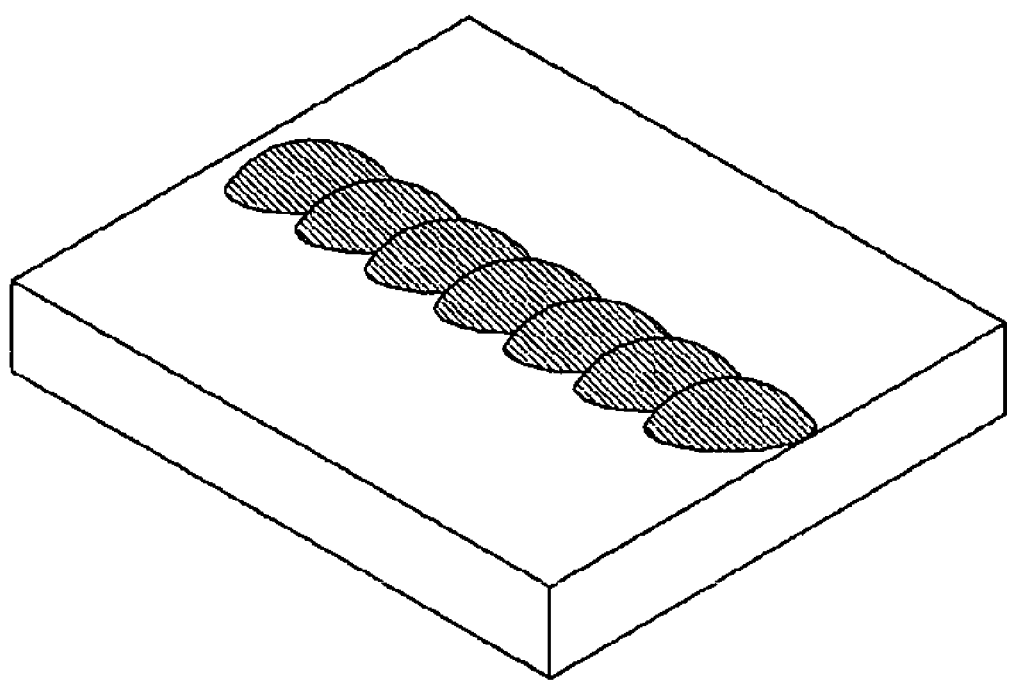

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Figure 2:
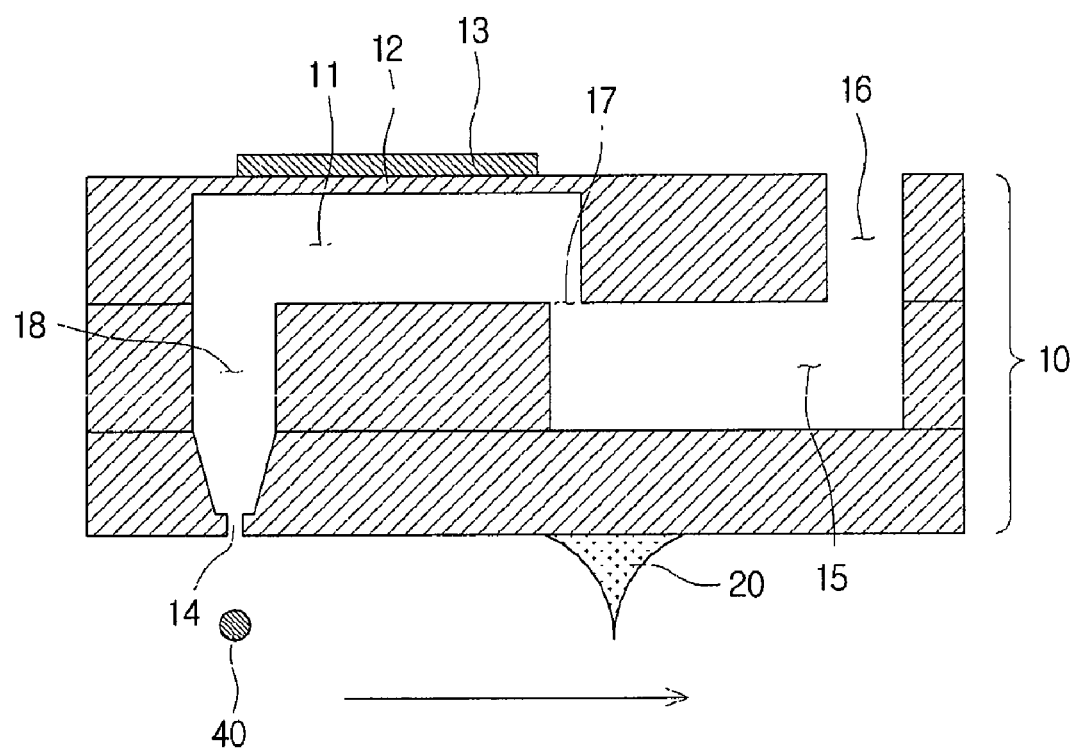
FIG. 2 is a cross-sectional view showing an inkjet head according to an embodiment of the present invention.
Figure 3A:
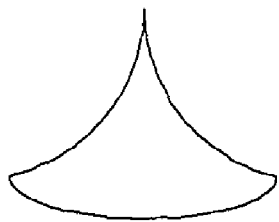
FIG. 3A through FIG. 3D show various examples of a protrusion.
Figure 3B:
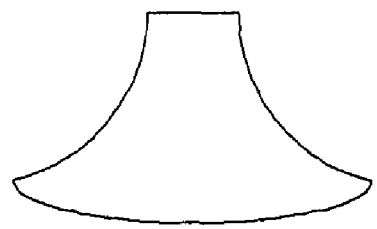
Figure 3C:
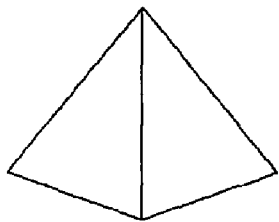
Figure 3D:

Hereinafter, an inkjet head according to an embodiment of the present invention will be described in detail with reference to the accompanying drawings. Identical or corresponding elements will be given the same reference numerals, regardless of the figure number, and any redundant description of the identical or corresponding elements will not be repeated Prior to the detailed description related to an inkjet head manufacturing method in accordance with an embodiment of the present invention, the elements of the inkjet head will be briefly described with reference to FIG. 2.

A chamber 11 can contain ink and discharge the ink by pushing the ink toward a nozzle 14, when pressed by an actuator 13 mounted in an upper side of a vibration plate 12.

A reservoir 15 can receive ink from the outside through an inlet 16, store the ink, and supply the ink to the chamber 11.

A restrictor 17 can connect the reservoir 15 and the chamber 11 and control the flowing of the ink between the reservoir 15 and the chamber 11. The restrictor 17 can have a cross-section that is smaller than those of the reservoir 15 and the chamber 11. The restrictor 17 can also adjust the amount of ink supplied from reservoir 15 to the chamber 11 if the vibration plate 12 is vibrated by the actuator 13.

The nozzle 14 can be connected to the chamber 11 to receive the ink and spray the ink. If the chamber 11 is pressed by the vibration, which has been generated by the actuator 13 and transferred to the chamber 11 through the vibration plate 12, this pressure can allow the nozzle 14 to spray ink 40.

On the other hand, a damper 18 can be placed between the reservoir 15 and the chamber 11. The damper 18 can concentrate the energy generated in the chamber 11 toward the nozzle 14 and buffer a rapid change in pressure.

In accordance with an embodiment of the present invention, the inkjet head can include a head body 10, having the same structure as the above, and a protrusion 20, formed in a lower side of the head body 10. That is, the protrusion 20 protruding in the lower direction can be formed in the lower side of the head body 10 in which the nozzle 14 is formed and spaced from the nozzle 14 by a predetermined distance.

Figure 4:
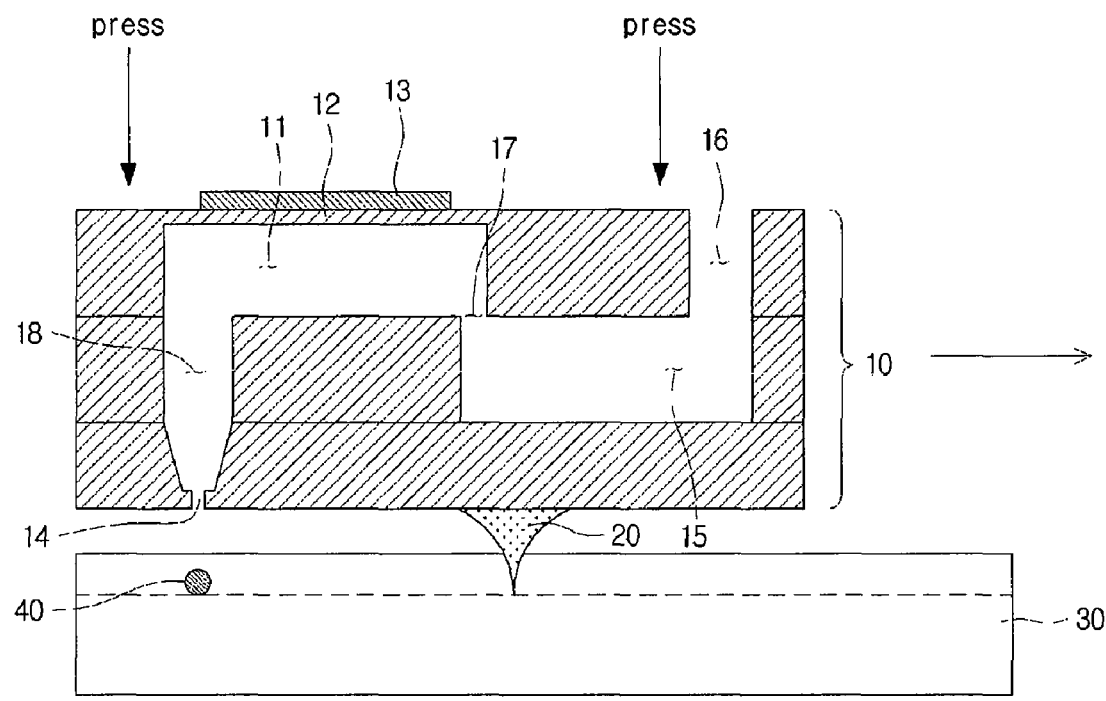
FIG. 4 is a side view showing how an inkjet head performs the printing according to an embodiment of the present invention.
Figure 5:
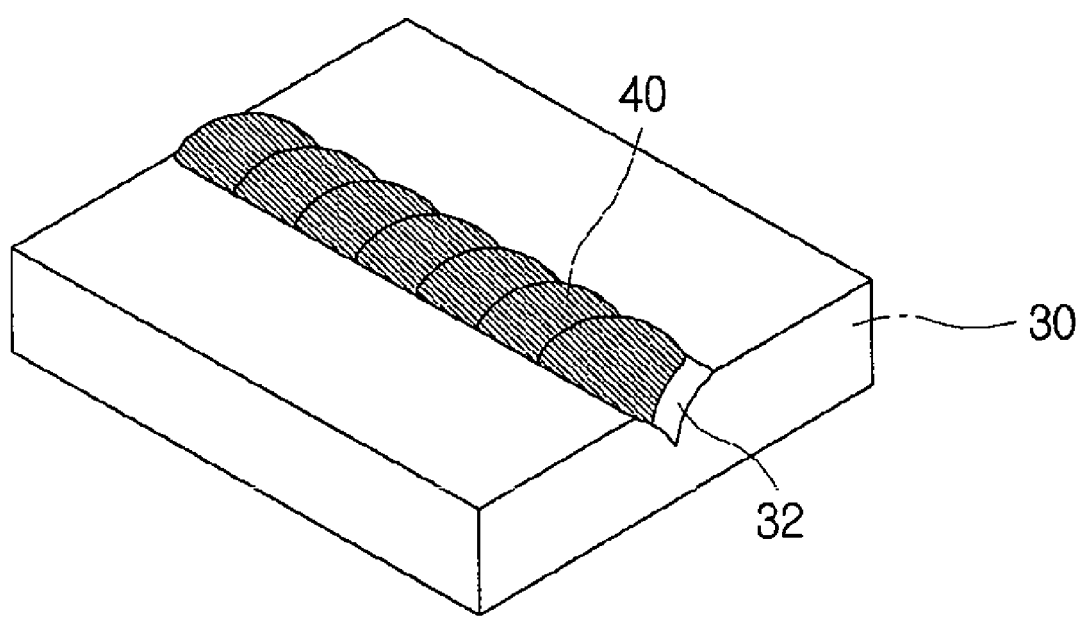
FIG. 5 shows a result printed by an inkjet head according to an embodiment of the present invention.

In the case of using the inkjet head having the protrusion 20 that is formed in the lower side, when a metal line, for example, is printed by discharging the metal 40 on a board 30 (refer to FIG. 4), if there is adequate pressure on the inkjet head, a groove 32 (refer to FIG. 5) can be formed on the surface of the board 30 by the protrusion 20 (refer to FIG. 4). The ink 40 discharged from the nozzle 14 can be stably placed at the groove 32 formed in the board 30 by the protrusion 20. The stably-placed ink 40 can be prevented from being scattered by the groove 32, thereby having the high aspect ratio (refer to FIG. 5).

It can be also expected that the ink 40 is more effectively adhered to the surface of the board 30, on which the ink is to be discharged, simply by physically scratching the surface even though the groove 32 is not deeply formed. If the board 30 is made of a flexible material such as a polymer, more effective result can be expected.

FIG. 3A through FIG. 3D show various examples of the protrusion 20. As shown in FIG. 4, the groove 32 can be more easily formed on the board 30 by forming the sharp protrusion 20. Of course, the shapes and sizes of the protrusion 20 can vary according to the conditions, such as the shapes of lines.

The protrusion 20 can be formed in front of the nozzle 14 (in the forwarding direction of the head) when a nozzle plate placed on a lower side of the head body 10 is formed. That is, the protrusion 20 and the head body 10, especially the nozzle plate formed with the nozzle 14, can be formed as one body. As necessary in the manufacturing process, the protrusion 20 can be also formed separately from the head body 10 and then attached to the lower side of the head body 10.

Of course, it may be impossible to apply the inkjet head according to this embodiment of the present invention to every case. This is because even though some nozzles discharge ink and the other nozzles do not discharge ink in an inkjet head in which 128 or 256 nozzles are formed, the inkjet head having the above structure always scratches the surface of the board.

Accordingly, the inkjet head according to this embodiment of the present invention can show an effective result in the case of repeatedly printing certain patterns, for example, the metal mesh, which is one of the designed transparent electrodes of a solar cell.

In this case, all nozzles can discharge metal ink to print a mesh, and each of the protrusions can be formed in front of every nozzle to pre-form all parts in which the discharged metal ink is to be stably placed.

Hitherto, although a certain embodiment of the present invention has been shown and described, it will be appreciated by any person of ordinary skill in the art that a large number of modifications, permutations and additions are possible within the principles and spirit of the invention, the scope of which shall be defined by the appended claims and their equivalents.

Many other embodiments can be included in the scope of claims of the present invention.

What is claimed is:

1. An inkjet head for discharging ink on a surface of a board, the inkjet head comprising:
    a head body, one side of which is formed with a nozzle for discharging the ink; and
    a protrusion, formed in one side of the head body, spaced from the nozzle,
    wherein the protrusion forms a groove on a portion on which the ink is discharged of the surface of the board.

2. The inkjet head of claim 1, wherein a plurality of nozzles are formed, and a plurality of protrusions are formed corresponding to the nozzles.

3. The inkjet head of claim 1, wherein the protrusion is made of a same material as that of the head body.

4. The inkjet head of claim 1, wherein an end of the protrusion has a pointed shape.

* * * * *